United States Patent [19]

Matuura et al.

[11] Patent Number: 4,985,509
[45] Date of Patent: Jan. 15, 1991

[54] HEAT CURABLE RESIN COMPOSITION

[75] Inventors: Hidekazu Matuura; Yasuo Miyadera, both of Shimodate; Toshihiko Kato, Ibaraki, all of Japan

[73] Assignee: Hitachi, Ltd., Tokyo, Japan

[21] Appl. No.: 352,659

[22] Filed: May 12, 1989

Related U.S. Application Data

[63] Continuation of Ser. No. 33,267, Apr. 2, 1987, abandoned.

[30] Foreign Application Priority Data

Apr. 18, 1985 [JP] Japan .................................. 60-83095
Apr. 2, 1986 [JP] Japan .................................. 61-76107

[51] Int. Cl.$^5$ ........................................... C08L 79/08
[52] U.S. Cl. ..................................... 525/426; 525/436
[58] Field of Search ................................ 525/426, 436

[56] References Cited

U.S. PATENT DOCUMENTS 3,842,143 10/1974 Winter et al. ...................... 525/426
4,110,294 8/1978 Pickering et al. .................. 525/426
4,362,826 12/1982 Yonezawa et al. ................. 525/426

FOREIGN PATENT DOCUMENTS 48-18960 6/1973 Japan .
00044626 3/1982 Japan ................................ 525/426

Primary Examiner—Ana L. Carrillo
Attorney, Agent, or Firm—Antonelli, Terry, Stout & Kraus

[57] ABSTRACT

A heat curable resin composition comprising (A) a polyimide and (B) a polymaleimide is excellent in heat resistance and suitable for use as a film-shaped adhesive, a laminate or a molding material.

5 Claims, No Drawings

HEAT CURABLE RESIN COMPOSITION

This application is a continuation of application Ser. No. 07/033,267, filed Apr. 2, 1987, now abandoned.

BACKGROUND OF THE INVENTION

The present invention relates to a resin composition heat curable into products excellent in heat resistance, which is useful for film-shaped adhesive, lamination materials, molding compounds, and so forth.

Most of the polyimides used hitherto for heat resistant adhesives, lamination materials, etc. have been made from bismaleimide and 4,4'-diaminodiphenylmethane. Compositions based on this type of polyimide are handled in powder form because of the low storage stability of their solutions. Hence, when used for such purposes as mentioned above, these compositions are dissolved in solvents before processing.

However, such a composition itself cannot be cast into films because of its hard and brittle nature. When it is used for lamination materials and the like, its solution is prepared, and supports or reinforcements such as glass cloths are impregnated with the solution and then dried by heating to form prepregs. Accordingly, it is impossible to produce thin lamination materials or the like, since the thinness of such prepregs is limited by the thickness of the supports Japanese Patent Publication No. 48-18960 discloses polyethersulfoneimide. This imide resin has a high softening point and hence involves a problem of its low bonding strength and high degree of thermal shrinkage.

On the other hand, Japanese patent application Laid-Open Ser. No. 56-161457 discloses a polyamide-acid resin composition containing a maleimide compound. However, compositions based on polyamide-acid resins have drawbacks in that high temperatures are required for the ring closure and the condensation by-product water tends to form voids in the molded articles.

Further, Japanese patent application Laid-Open Ser. Nos. 55-123622 and 59-179558 disclose polyimide resin compositions containing maleimide compounds. When polyimide resins are employed, the problem of the water formation by condensation does not arise but the polyimides exemplified in the patent applications have high softening points so that large amounts of maleimide compounds need to be added in order to lower molding temperatures of the compositions. As a result, the resin compositions become brittle and hence cannot be used in any form but in the form of materials reinforced with glass cloths or the like and in the form of powders for molding purposes When the contents of maleimide compounds are low, it is necessary for the production of prepregs to leave large amounts of solvents in the prepregs in order to lower the molding temperatures thereof, since the softening points are high. This raises the problem of the formation of voids in the molded products.

SUMMARY OF THE INVENTION

The present invention provides a heat curable resin composition which, before heat curing, can be formed into sheets and the like and after curing, offers high toughness, flexibility, adhesiveness, and heat resistance.

According to the invention, there is provided a heat curable resin composition comprising (A) a polyimide having repeating units of the formula:

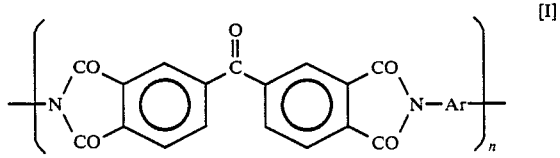

wherein Ar is a divalent group containing

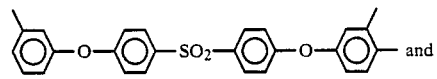

and

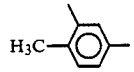

in a molar ratio of 100:0 to 10:90, and n is an integer of 2 or more, and (B) a polymaleimide of the formula:

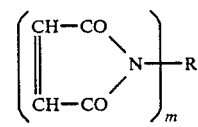

wherein R is a hydrocarbon group having a valence of 2 or more or a diphenoxy group and m is an integer of 2 or more.

DESCRIPTION OF THE PREFERRED EMBODIMENTS

In the present invention, polyimide (A) can be produced by heating 3,3',4,4'-benzophenonetetracarboxylic dianhydride (hereinafter abbreviated as BTDA), bis {4-(3-aminophenoxy)phenyl}sulfone (hereinafter abbreviated as m-APPS), and 2,4-diaminotoluene (hereinafter abbreviated as 2,4-DAT) in a solvent such as cresol or phenol with stirring. Polyimide (A) can also be produced by reacting said materials in an aprotic polar solvent such as dimethylacetamide or dimethylformamide at room temperature or below to give the corresponding polyamide-acid, followed by the dehydration and ring closure of the polyamide-acid in the presence of a ring closing agent such as an acetic anhydride-pyridine mixture. For the preparation of the polyimide, such a method of the dehyration and ring closure of the polyamide-acid by use of a ring closing agent (chemical ring closure) is preferred to the method of thermal ring closure. Reasons for this are that in the case of the thermal ring closure, a gel is formed through a side reaction and hence the softening point of the product rises or a solvent-insoluble matter is formed, and that the chemical ring closure requires a reaction period of about 5 hours whereas the thermal ring closure requires a reaction period of 10 hours or more.

The ring closing agent used herein is a combination of a dehydrating agent such as an acid anhydride (e.g. acetic anhydride, propionic anhydride, or benzoic anhydride) or carbodiimide with a tertiary amine catalyst such as pyridine, isoquinoline, trimethylamine, aminopyridine, or imidazole.

Suitable amounts of the ring closing agent for use herein, based on the polyamide-acid, are at least 1 equivalent of the dehydrating agent and 0.01 to 1 equivalent of the catalyst. It is preferred to use acetic anhydride in an amount of 1 to 2 equivalents and pyridine in an amount of 0.5 to 1 equivalent to the polyamide-acid. The reaction is carried out at a temperature of $-10°$ to $+70°$ C., preferably $-5°$ to $+5°$ C., for a period of 0.5 to 5 hours, preferably 1.5 to 3 hours.

The molar ratio of m-APPS to 2,4-DAT in polyimide (A) is desirably from 100:0 to 10:90, preferably from 90:10 to 30:70. When 2,4-DAT is in excess of 90 mole %, polyimide (A) will be hard and inferior in moldability.

Examples of suitable polymaleimides (B) for use in the present invention are N,N'-(4,4'-diphenylmethane)-bismaleimide, N,N'-(4,4'-diphenyloxy)bismaleimide, N,N'-p-phenylenebismaleimide, N,N'-m-phenylenebismaleimide, N,N'-2,4-tolylenebismaleimide, N,N'-2,6-tolylenebismaleimide, N,N'-ethylenebismaleimide, N,N'-hexamethylenebismaleimide, and the respective polymaleimides of the formulae:

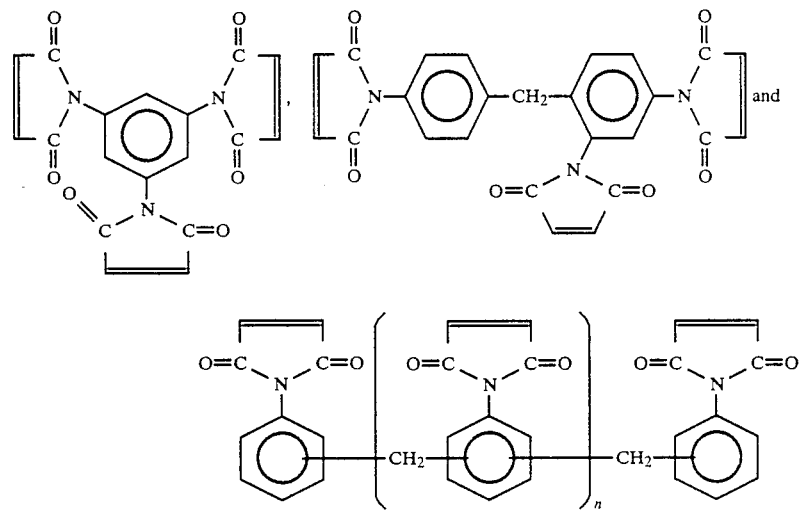

wherein n is an integer of 1 or more.

These polymaleimides may be used alone or in combination.

The mixing proportion of polymaleimide (B) is from 5 to 50%, preferably from 5 to 30%, by weight based on the total amount of polyimide (A) and polymaleimide (B). When the proportion of polymaleimide (B) is less than 5% by weight, the composition will not sufficiently be cured. When the proportion is more than 50% by weight, the composition will be brittle and its moldability will be lost.

Mixing of polyimide (A) with polymaleimide (B) may be performed in powder form but usually is carried out by adding and dissolving the latter in a varnish of the former.

The thus obtained resin composition can be used as prepregs, which are produced by impregnating supporting materials such as glass cloths, aramid cloths, and carbon cloths with the composition in a solution state, followed by drying them. The composition can also be used as unsupported sheet-shaped adhesives for various purposes, which are produced by spreading the composition in a solution state on glass plates, stainless steel sheets, or the like and dried. In these cases, the optimum drying temperature and period depend on the kinds of solvent and polymaleimide used. The temperature needs to be maintained below the level from which upward the polymerization of the polymaleimide becomes notable and the period needs to be chosen so that the amount of the remaining solvent will not exceed 2%.

The present composition in powder form can also be used as such for molding. Tough and heat resistant molded articles can be obtained by heat curing of uncured moldings of the composition. In this case, the optimum curing temperature depends on the kind of polyimide used.

EXAMPLE 1

In a four-necked flask equipped with a stirrer, a thermometer, a nitrogen gas inlet tube, and a condenser, were placed 32.2 g of BTDA, 21.6 g of m-APPS, and 6.1 g of 2,4-DAT and then were added 539 g of m-cresol and 108 g of toluene. The mixture was heated with stirring while blowing nitrogen gas into the solution. The reaction for 16 hours at a temperature of 150° to 160° C. gave a polyimide varnish of 17.8% resin content and 15 P viscosity. Then a resin composition was prepared by dissolving 3.56 g of N,N'-(4,4'-diphenylmethane)-bismaleimide (BMI) in 100 g of the polyimide varnish. This resin composition did not gel during storage at room temperature even for one month. A portion of the composition was spread on a glass plate, and dried at 160° C. for 30 minutes, giving a soft uncured film 25 μm thick. A tough cured film was obtained by heating this film at 250° C. for 30 minutes. This cured film did not melt in a solder bath at a temperature as high as 300° C.

The above uncured film can be used as a film-shaped adhesive for the following purposes: the fabrication of substrates for flexible circuit boards by inserting said film between a flexible base film and a copper foil, and applying heat and pressure (molding) to the superposed layers; fabrication of metal cored substrates for circuits boards by inserting said film between a metallic substrate and a copper foil, and applying heat and pressure to the superposed layers; application of said film as an insulating layer in the fabrication of multilayer circuit boards according to the build-up method; and application of said film as an adhesive for bonding a flexible circuit board to a rigid circuit board.

The film-shaped adhesive has the following advantages: It is formed from the resin composition only, that is, it contains no supporting material (or reinforcement) such as a glass cloth. Therefore it can be made thin without particular restriction. For instance, it is possible to reduce the thickness of the insulating layer to be formed between a copper foil and a substrate for a circuit board, when the film-shaped adhesive is used for the insulating layer. In order to secure impedance matching, it is necessary to decrease the thickness of such an insulating layer as the conductor width is decreased. This requirement can be satisfied and finer circuit patterns can be formed, by using the film-shaped adhesive. In addition, the surface of the present adhesive is smoother than that of the prepreg that contains a supporting material such as a glass cloth, so that the surface of the copper foil laminated on the film-shaped adhesive is relatively smooth. When a photoresist applied on the copper foil is etched, the light exposure of the photoresist therefore can be accomplished as designed and a highly precision circuit pattern can be formed. Moreover, while the application adhesives in varnish form needs the steps of coating, drying and curing, the application of the film-shaped adhesive does not need any of the steps of coating and drying. Further, varnishes with high viscosities are difficult to coat uniformly while those with low viscosities need the bothersome operation of recoating in order to form relatively thick films In both cases, it is difficult to provide uniform film thickness. Since the drying of varnishes applied on substrates proceeds more on the side opposite to the substrate, large amounts of solvents tend to remain and this will raise a problem in the heat resistance. The film-shaped adhesive involves no such problem

EXAMPLE 2

A portion of the resin composition varnish prepared in Example 1 was spread on a glass plate, and dried at 160° C. for 30 minutes, giving a 25-μm thick film-shaped adhesive. This adhesive was put between a 1-mm thick aluminum plate and a 35-μm thick copper foil. The whole layer was pressed under the conditions of 50 kg/cm$^2$, 250° C., and 30 minutes to form a laminate. The copper foil peel strength was 2.5 kg/cm. Immersion of the laminate in a solder at 300° C. for 60 seconds caused neither blistering nor peeling.

EXAMPLE 3

A resin composition was prepared by adding and dissolving N,N'-(4,4'-diphenylmethane)bismaleimide in the same varnish obtained in Example 1 so as to make the former 75 parts by weight based on 25 parts by weight of the polyimide contained in the varnish. This resin composition was spread on a glass plate, and dried at 160° C. for 30 minutes, but the resulting coat was too fragile to be taken up as a film. This composition, however, was found to be available as an adhesive in varnish form and a molding compound for applications where heat resistance is necessary.

EXAMPLE 4

In a four-necked flask equipped with a stirrer, a thermometer, a nitrogen gas inlet tube, and a condenser, were place 32.2 g of BTDA, 21.6 g of m-APPS, and 6.1 g of 2,4-DAT and then were added 539 g of m-cresol and 108 g of toluene. The mixture was heated with stirring while blowing nitrogen gas into the solution. The reaction for 16 hours at a temperature of 150 to 160° C. gave a polyimide varnish of 17.8% resin content and 15 P viscosity. Then a polyimide powder was prepared by pouring the polyimide varnish in acetone to reprecipitate the polyimide, and crashing, washing and drying it. This polyimide powder showed a reduced viscosity of 0.72 dl/g (concentration 0.1 g/dl, solvent N,N-dimethylformamide (DMF), temperature 30° C.). Further a varnish was prepared by dissolving 100 g of the polyimide powder and 10 g of N,N'-(4,4'-diphenylmethane)bismaleimide (BMI) in 400 g of DMF. This varnish was spread on a glass plate, and dried at 130° C. for 10 minutes The coating was peeled off, fixed on an iron frame, and dried at 200° C. for 1 hour, giving a film-shaped adhesive. This adhesive film was found to have a thickness of 25 μm, 1% of the remaining solvent, and a softening point of 230° C. and did not crack on 180° bend, thus being excellent in flexibility. The reprecipitated polyimide contained less voids in its molded products and showed higher heat resistance than did the polyimide which was not subjected to reprecipitation.

EXAMPLE 5

An adhesive in film form was prepared in the same manner as in Example 4 except that 20 g of BMI-M (a polymaleimide made by Mitsui-Toatsu Chemical Inc.) was added in place of N,N'-(4,4'-diphenylmethane)-bismaleimide. This adhesive film was found to have a thickness of 25 μm, 1.1% of the remaining solvent, and a softening point of 235° C. and did not crack on 180° bend, thus being excellent in flexibility.

COMPARATIVE EXAMPLE 1

A varnish prepared by dissolving 100 g of KERIMID 601 (a polyaminobismaleimide resin made by Nippon Polyimide Co., Ltd.) in 100 g of DMF was spread on a glass plate, and dried at 130° C. for 10 minutes and then at 170° C. for 20 minutes, but the resulting coat was too fragile to be taken up as a film. Moreover the varnish was inferior in storage stability.

EXAMPLE 6

In a four-necked flask equipped with a stirrer, thermometer, and a calcium chloride-filled tube, were placed 21.6 g of m-APPS, 6.1 g of 2,4-DAT, and 239.6 g of DMF to form a solution. Then, 32.2 g of BTDA was added in several parts to this solution while keeping the temperature at or below 10° C. Stirring of the mixture was continued for 3 hours, giving a polyamide-acid varnish. This varnish was stirred together with 25.5 g of acetic anhydride and 19.8 g of pyridine for 2 hours to give a polyimide varnish. This varnish was poured into water to reprecipitate the polyimide, which was then crashed, washed, and dried, giving a polyimide powder. The reduced viscosity of this polyimide was 0.84 dl/g. A varnish was prepared by dissolving 100 g of this polyimide powder and 10 g of N,N'-(4,4'-diphenylmethane)bismaleimide (BMI) in 400 g of DMF. This varnish was spread on a glass plate, and dried at 130° C. for 10 minutes. The coating was peeled off, fixed on an iron frame, and dried at 200° C. for 1 hour, giving an adhesive in film form. This adhesive film was found to have a thickness of 25 μm, 1% of the remaining solvent, and a softening point of 230° C. and did not crack on 180° bend, thus being excellent in flexibility.

EXAMPLES 7-10 AND COMPARATIVE EXAMPLE 2

Film-shaped adhesives were prepared in the same manner as in Example 6 except that the amount of BMI was varied as shown in Table 1. Each adhesive film was put between a 1-mm thick aluminum plate and a 35-μm thick one-side-roughened copper foil. The superposed layers were pressed under the conditions of 50 kgf/cm², 275° C., and 30 minutes, giving copper-clad substrates. Characteristics of these substrates are shown in Table 1.

TABLE 1

|  | Amount of BMI (phr) | Softening point (°C.) | Copper foil peel strength (kgf/cm) | Resistance to hot solder (300° C.) (60 sec.) |
|---|---|---|---|---|
| Comparative Example 2 | 0 | 250 | 0.6 | o |
| Example 7 | 10 | 230 | 2.7 | o |
| Example 8 | 30 | 195 | 2.6 | o |
| Example 9 | 50 | 180 | 2.5 | o |
| Example 10 | 70 | * | | |

(Note) * The composition did not have flexibility and hence film formation therefrom was impossible. But, the composition can be used as an adhesive in varnish form and a molding compound. The softening point was measured by the penetration method with a load of 25 kg/cm² and a temperature rise rate of 10° C./min.

The copper foil peel strength is the 90° peel strength measured at a drawing speed of 50 mm/min.

The resistance to hot solder was evaluated by floating a 20-mm square test piece of the substrate on a solder bath with the copper foil side directed downward, and inspecting whether blistering took place.

EXAMPLE 11

A substrate for a flexible printed wiring board was prepared by putting one sheet of the film-shaped adhesive prepared in Example 4 between a 50-μm thick polyimide film and a 35-μm thick copper foil having one roughed side, and pressing the superposed layers under the conditions of 50 kgf/cm², 275° C., and 30 minutes. The 90° copper foil peel strength, measured at a drawing speed of 50 mm/min, was 2.8 kgf/cm at room temperature and 2.4 kgf/cm at 150° C. Immersion of this substrate in a solder bath at 300° C. for 1 minute caused no blistering.

EXAMPLE 12

A film-shaped adhesive was prepared in the same manner as in Example 6 but using 30 phr BMI. Each side of a 50-μm thick polyimide film was overlaid with a sheet of the adhesive and then with a 35-μm thick copper foil having one roughed side. The superposed layers were pressed under the conditions of 50 kgf/cm², 275° C., and 30 minutes, giving a substrate for a flexible printed wiring board.

The 90° copper foil peel strength of this substrate was 2.5 kgf/cm at room temperature and 2.3 kgf/cm at 150° C. Immersion of this substrate in a solder bath at 300° C. for 1 minute caused no blistering.

EXAMPLE 13

A substrate for a flexible printed wiring board was prepared in the same manner as in Example 8 by using a film-shaped adhesive which was prepared in the same manner as in Example 6 but using 15 g of BMI-M (a polymaleimide made by Mitsui-Toatsu Chemicals Inc.) in place of BMI.

The 90° copper foil peel strength of this substrate was 2.5 kgf/cm at room temperature and 2.1 kgf/cm at 150° C. Immersion of the substrate in a solder bath at 300° C. for 1 minute caused no blistering.

COMPARATIVE EXAMPLE 3

A substrate for a flexible printed wiring board was prepared by laminating the same materials as used in Example 11, except that PYRALUX (a film-shaped acrylic adhesive made by DuPont Co.) was used in place of the film-shaped adhesive, under the conditions of 30 kgf/cm², 180° C., and 60 minutes. The 90° copper foil peel strength of this substrate was 2.2 kgf/cm at room temperature and 0.6 kgf/cm at 150° C. Immersion of the substrate in a solder at 300° C. for 1 minute caused blistering.

EXAMPLES 14 and 15

Film-shaped adhesives were prepared in the same manner as in Example 6 except that the molar proportions of m-APPS and 2,4-DAT were changed as shown in Table 2.

TABLE 2

|  | Molar proportion | | Softening point (°C.) | Copper foil peel strength (kg.f/cm) |
|---|---|---|---|---|
|  | m-APPS | 2, 4-DAT | | |
| Example 14 | 90 | 10 | 220 | 2.5 |
| Example 15 | 75 | 25 | 225 | 2.5 |

As described hereinbefore, the resin composition of the present invention is superior in solubility, stability, moldability, flexibility, adhesiveness, and heat resistance and useful for various applications.

What is claimed is:

1. An unsupported film-shaped adhesive consisting essentially of a heat curable resin composition comprising (A) a polyimide produced by using as a diamine component 90 to 30% by mol of bis sulfone and 10 to 70% by mol of 2,4-diamino-toluene and as an acid component 3,3',4,4'-benzophenone-tetracarboxylic dianhydride in substantially equimolar amounts, and (B) a polymaleimide of the formula:

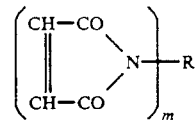

wherein R is a hydrocarbon group having a valence of 2 or more or a diphenoxy group; and m is an integer of 2 or more.

2. An unsupported film-shaped adhesive according to claim 1, wherein the diamine component and the acid component are used in equimolar amounts.

3. An unsupported film-shaped adhesive according to claim 1, obtained by casting a solution of the heat curable resin composition to form a film, drying the film with heating, and peeling off the film.

4. An unsupported film-shaped adhesive according to claim 1, wherein R is a hydrocarbon group having a valence of 2 or more.

5. An unsupported film-shaped adhesive according to claim 1, wherein the polymaleimide is at least one selected from the group consisting of N,N'-(b 4,4'-diphenyl-methane)-bismaleimide, N,N'-(4,4'-diphenyloxy)-bismaleimide N,N'-p-phenylenebismaleimide, N,N'-m-phenylenebismaleimide, N,N'-2,4-toylenebismaleimide, N,N'-2,6-tolylenebismaleimide, N,N'-ethylenebismaleimide, N,N'-hexamethylenebismaleimide, and polymaleimides of the formulae:

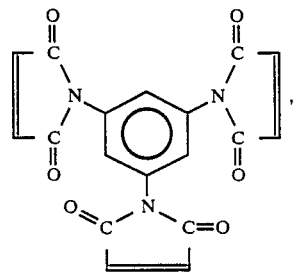

,

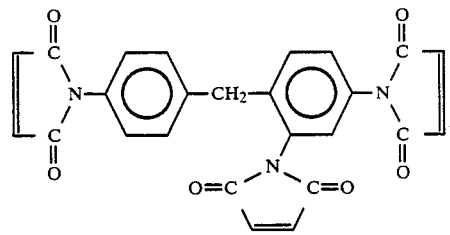

and

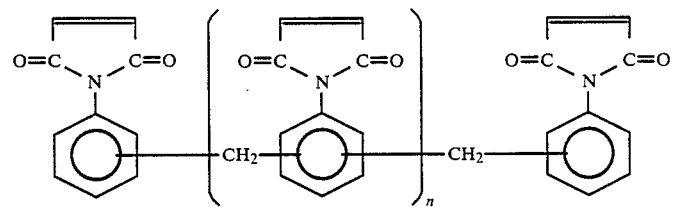

wherein n is an integer of 1 or more.

* * * * *

UNITED STATES PATENT AND TRADEMARK OFFICE
CERTIFICATE OF CORRECTION

PATENT NO. : 4,985,509
DATED : January 15, 1991
INVENTOR(S) : H. MATUURA, et al

It is certified that error appears in the above-identified patent and that said Letters Patent is hereby corrected as shown below:

In column 8, Claim 1, line 43, "bis sulfone" should read
--bis[4-(3-aminophenoxy)-phenyl]sulfone--

In column 9, Claim 5, line 3, "N,N'-(b4,4'-diphe-" should read
--N,N'-(4,4'-diphe- --;
line 40, "toylenebismaleimide" should read --tolylenebismaleimide--.

Signed and Sealed this

Seventeenth Day of November, 1992

Attest:

DOUGLAS B. COMER

*Attesting Officer*   *Acting Commissioner of Patents and Trademarks*